July 25, 1967 F. E. GENTRY 3,332,143

SEMICONDUCTOR DEVICES WITH EPITAXIAL CONTOUR

Filed Dec. 28, 1964

INVENTOR:
FINIS E. GENTRY,

BY Urban H. Faubion
HIS ATTORNEY.

United States Patent Office 3,332,143

Patented July 25, 1967

3,332,143

SEMICONDUCTOR DEVICES WITH EPITAXIAL CONTOUR

Finis E. Gentry, Skaneateles, N.Y., assignor to General Electric Company, a corporation of New York Filed Dec. 28, 1964, Ser. No. 421,379
3 Claims. (Cl. 29—583)

ABSTRACT OF THE DISCLOSURE

Individual junction-protected semiconductor devices are formed by providing a semiconductor wafer with at least two zones of opposite conductivity type defining at least one rectifying junction subjacent a face thereof. The junction is exposed around what ultimately forms the individual rectifier pellets by forming grooves in one surface of the device which extend through the junction to define individual pellets for subsequent pelletizing. In another embodiment, the junction is formed by initially diffusing the junction in to form discrete regions with the junction exposed around the peripheral areas of the individual pellets. A layer of semiconductor material of the same conductivity as the face portion but lightly doped relative thereto is epitaxially deposited to cover the exposed portions of the junction and the wafer is severed between the exposed junctions leaving the junction portions covered to form individual junction-protected pellets for semiconductor devices.

This invention relates to a means for improving the characteristics of semiconductor materials which have at least one internal junction between two zones of different conduction characteristics and the characteristics of devices which utilize such materials. The invention is directed toward means for increasing the reverse or inverse voltage which may be applied to such devices without a breakdown and to increase the ability of such devices to dissipate power when the device does break down in the reverse direction. Reverse, or inverse, voltage as used here is a voltage which is of a polarity that would normally cause conduction to take place across a given junction in the direction of high impedance. The invention provides methods for producing such device structures using epitaxial deposition and includes methods which make it practical to utilize pellets of the type referred to in the art as planar for high voltage applications.

A junction between zones of a semiconductor material having opposite type conduction characteristics provides a low resistance path to an electric current flowing across the junction in one direction, and a high resistance path to current flow in the opposite direction. A voltage which is of such a polarity as to force a current across the junction in the direction of higher resistance is the inverse voltage referred to above. When an inverse voltage is applied across the junction between zones of semiconductor material having an excess of free electrons (N type conduction characteristics) and an excess of positive holes (P or positive conduction characteristics) respectively, the region surrounding the junction becomes deficient of free electrons and positive holes (known as carriers). The reason that this happens is that when a positive voltage is applied at the negative type conduction zone and a negative voltage applied at the positive type conduction zone, the positive carriers are attracted to the negative voltage terminal and the negative carriers are attracted to the positive voltage terminal. Thus, the carriers on both sides of the junction are attracted away from the junction to form a region (called the depletion region or space charge layer). The depletion region is a dielectric because of the deficiency of carriers of either type.

The dielectric depletion region is highly resistive and is capable of withholding high voltages. For example, in most practical devices, the dielectric depletion region is capable of withstanding a reverse voltage of several hundred volts without breaking down through the bulk of the material. However, most devices are not capable of withstanding more than a relatively small fraction of the voltage which the bulk will hold in the reverse direction (either transient or steady state) due to the fact that breakdown first occurs across or around the surface. For this reason, it is said that most such devices are surface limited.

The fact that most rectifiers are surface limited places severe limitations on the usefulness of the devices. To begin with, it means that the device cannot be used in circuits where reverse voltages (either steady state or transient) of over a few hundred volts are likely to occur without taking special precautions (frequently elaborate) to prevent application of the reverse voltage directly across the device.

As serious as this drawback appears, it is perhaps not as serious as other disadvantages which occur because such devices are surface limited; viz, device instability, and destruction of the device upon surface breakdown in the reverse direction.

Device instability is most frequently due to the fact that the condition of the semiconductor surface changes. The characteristics of such devices vary considerably with the condition of the surface. Therefore, unless some precautions are taken to assure that the surface condition will not change appreciably during the use of the device, the device stability is very poor. Actually it is much more difficult to control condition of the surface of the material than it is to control the characteristics of the bulk and it is certainly more difficult to control or prevent changes in surface condition than to control the essentially constant bulk characteristics. The fact of the matter is that even with elaborate precautions such as utilizing various kinds of surface treatment and placing the semiconductor material in an evacuated hermetically sealed container, the predominant failure mechanism of rectifier devices during operation is a result of surface degradation.

As to the point concerning device destruction, it is a well recognized fact that typical rectifiers (which are surface limited devices) may be permanently damaged or destroyed by only a few watts of power absorbed during breakdown, as from a very brief voltage transient, in the reverse or blocking direction. The fact that the bulk material can dissipate a great deal of energy is readily apparent by taking as an example a typical silicon rectifier and considering that such devices can, at least momentarily, dissipate 1000 watts of heat in the forward direction of current flow without any damage whatsoever. This apparent anomaly can be explained by considering the fact that for conduction in the forward direction, current and its attendant heat losses spread out equally over the entire junction area, permitting maximum utilization of the entire rectifier cooling mechanism and its thermal capacity. However, in the reverse direction, the rectifier surface current under momentary high peaks of blocking voltage finds some microscopic flaw or weakness at which to concentrate. Such weak spots usually occur at the junction surface where the rectifying junction emerges from the silicon pellet. At these minute spots, a fraction of a watt of concentrated heat may be sufficient to melt and destroy the blocking properties of the rectifier, regardless of size of the rectifier. The inverse voltage problem is so critical that transient rating in the reverse direction is done on the basis of voltage rather than energy.

When failure due to reverse voltage applied to the rectifier takes place through the bulk of the material instead of over the surface, the device can dissipate approximately as much energy, both steady state and transient, in its reverse direction as in its forward direction. When the device breaks down through the bulk and current flows in the reevrse direction, the breakdown is called "avalanche breakdown" (sometimes mistakenly called "zener" breakdown"). Avalanche breakdown of a silicon rectifier diode is an inherently non-destructive characteristic that is widely used at relatively low power and voltage levels as a constant voltage reference and regulator in so-called "zener" diodes. Like a zener diode, a rectifier operated within its thermal limitations maintains substantially constant voltage across it in the avalanche region regardless of current in this region. As long as the energy is limited by the external circuit to the thermal capability of the device, no damage results from true avalanche action. Hence, a device with uniform avalanche breakdown occurring at a voltage below that at which local dielectric surface breakdowns occur, can dissipate hundreds of times more reverse energy with transient overvoltage conditions than one where the converse is true.

Perhaps it is well to point out that breakdown is likely to occur at the surface of the semiconductor material because of the high voltage gradient at the surface of the device. Stated in another way, breakdown occurs at the surface due to high concentration of electric fields at the surface. As a practical matter, the place where the electric field is usually of the highest intensity is in the vicinity of the junction between the two zones of opposite conduction type characteristics. For example, the transition region or junction between the two different conduction zones may be on the order of $10^{-3}$ centimeters in thickness. Thus, it is readily seen that a very strong electric field (high electric field intensity) occurs at a surface area of the body intercepted by the junction.

A number of approaches have been developed to provide semiconductor devices wherein breakdown due to reverse voltage occurs within the bulk of the material of the semiconductor device instead of at the surface and semiconductor devices with surface stability problems largely eliminated.

One approach to minimizing surface problems is known in the art as the planar passivation technique. This method involves masking a semiconductor body of one conductivity type with an oxide and either forming or leaving an opening in the oxide. The opposite conductivity type doping material is diffused into the body through the opening to form a junction which comes to the surface of the body under the oxide layer. The oxide is an insulating layer which protects (passivates) the surface of the body, particularly where the junction comes to the surface. The planar passivation technique works well for small signal, low voltage devices but it is not practical for devices requiring avalanche breakdown characteristics in excess of 500 volts due to process limitations. Sharp junction corners and the phenomenon known as pileup under the oxide are two principal factors which generally limit the breakdown voltage of devices manufactured by the planar process.

Device structures, particularly junction configurations, which can take advantage of the best features of the planar process (e.g. protected pellet surface) and at the same time extend the range of inverse voltage the device can withstand prior to breakdown and insure that the breakdown will occur in avalanche through the body are described and claimed in copending patent appliaction Ser. No. 421,380 filed concurrently herewith in the name of Finnis E. Gentry, entitled "Semiconductor Devices," and assigned to the assignee of the present invention. The resulting distribution of energy throughout the volume of the device structures provided allows safe, non-destructive dissipation of voltage transients which would otherwise result in destruction of the device.

The present invention relates to methods of producing device and junction structures described in the Finnis E. Gentry application supra. The structures provided in that application each include a semiconductor body having two major faces provided with at least two zones of opposite conductivity type defining a rectifying junction therebetween with one of the zones made up of two regions, one called internal because at least part of it occupies a portion of one major face of the pellet internally spaced from the body periphery, and a region which occupies a portion of the same major face, surrounding the internal region and having a sheet resistance which is higher than that of the internal region by an amount necessary to allow the space charge layer associated with the junction to spread over substantially the entire surface of the surrounding region prior to avalanche breakdown.

Accordingly, then, in carrying out the present invention, a method is provided which includes utilizing a semiconductor body with a number of discrete regions of one conductivity type each adjacent one zone of opposite conductivity type forming exposed rectifying junctions between each discrete region and the adjacent zone, and epitaxially depositing a layer of relatively high resistivity semiconductor material of the same conductivity type as the discrete regions at least on the exposed junctions.

The novel features which are believed to be characteristic of the invention are set forth with particularity in the appended claims. The invention itself, however, both as to its organization and method of operation together with further objects and advantages thereof may best be understood by reference to the following description taken in connection with the accompanying drawings in which:

Figure 1:
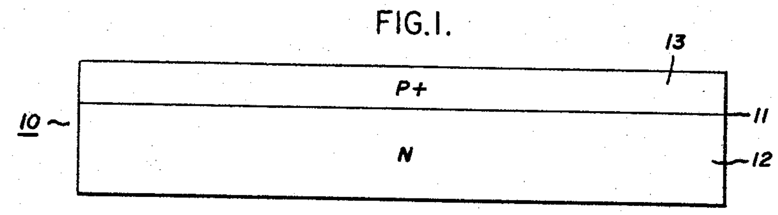
FIGURE 1 is a central vertical section through a P+N semiconductor wafer from which rectifier pellets are constructed in accordance with the present invention.

Referring specifically to FIGURE 1, a semiconductor wafer 10 is illustrated which has a rectifying junction 11 formed between a lower N conductivity type zone 12 and an upper P type conductivity zone 13. The wafer is preferably formed by starting with an N conductivity type body having a resistivity of about 18 ohm-centimeters and diffusing in a P type dopant to form the P type conductivity zone 13. As an example, the upper P conductivity type zone 13 may be boron diffused to a depth of about 1.8 mils with a surface impurity concentration of $1 \times 10^{20}$ atoms per cubic centimeter.

Figure 3:
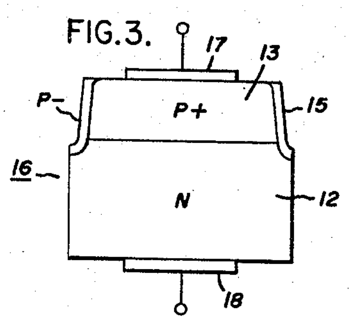
FIGURE 3 is a central vertical section through the rectifier pellet constructed from the wafer of FIGURE 1 and illustrating a rectifier constructed in accordance with the method explained in connection with the steps illustrated in FIGURES 1, 2 and 3.

The next step is to form a number of discrete regions of the P type conductivity material in the zone 13 which discrete regions correspond to pellets ultimately to be formed (e.g. FIGURE 3). This is accomplished by etching or cutting a series of grooves 14 in the upper major face of the pellet 10. These grooves should be deep enough to go through the junction 11. Thus, the discrete regions of zone 13 are, in effect, a series of isolated islands of the N type zone 12.

Next, a layer 15 of high resistivity semiconductor material of the same conductivity type as the zone 13 is deposited on the upper major surface of the wafer 10. The deposited layer 15 in practical devices using today's technology may be .2 to .4 mil thick and have an average impurity concentration of about $1 \times 10^{15}$ atoms per cubic centimeter.

The next step in device construction is illustrated in FIGURE 3. FIGURE 3 illustrates a rectifying pellet 16 which represents one of the portions of the wafer 10 broken away at the grooves 14. Here, the portion of the P− type layer 15 which was deposited over the entire upper major surface of wafer 10 is lapped away to expose the upper surface of P+ type zone 13. Removal of this part of the layer 15 may not be necessary since the high surface concentration of the P+ zone 13 on which it is deposited may, during the process of deposition, sufficiently dope that portion of the layer of the epitaxially deposited layer 15 which comes in contact with the highly doped surface. However, in the embodiment illustrated, this portion of the epitaxially deposited layer 15 is removed. Subsequently, upper and lower electrodes 17 and 18 are applied to the upper and lower surfaces respectively of the pellet 16 in order to provide a practical rectifier.

The object in constructing the device by the method just described is to provide devices in accordance with the teachings found in copending patent application S.N. 421,380, filed concurrently herewith in the name of the present inventor, entitled "Semiconductor Devices," and assigned to the assignee of the present invention. That is, the method is used to provide a high resistivity region 15 around the upper P+ zone 13 in order to force the electric field to spread prior to avalanche breakdown of the junction.

It will be remembered that a primary reason for surface breakdown is a concentration of the electric field at the surface and in the region of the junction. Since the region 15 (of FIGURE 3) forces the electric field at the surface of pellet 16 to spread, it is called, for convenience, the field or space charge spread region. One way to look at the operation of the device is to consider that the field spread is caused or forced by doping the field spread region 15 so lightly (providing a high sheet resistance) that all of the carriers in the region are "used up" prior to avalanche breakdown. Note that this presupposes that region 15 has carriers of the same conductivity type as those found in the adjacent upper region zone 13 (consequently opposite to the carriers on the opposite side of the junction 11). Thus, making field spread region 15 (in FIGURE 3) intrinsic or slightly N type does not give the same field spread function.

From the above discussion, it may be concluded that the technique of zone spreading is governed by the number of impurity atoms (and sheet resistance) found in the region 15. For a given zone spreading effect, the larger the number of impurity atoms present per unit volume, the thinner the zone spreading region must be and conversely, the lower the number of impurity atoms per unit volume, the thicker it may be.

When a small reverse voltage is applied between electrodes 17 and 18 (i.e., electrode 17 negative with respect to electrode 18) a small depletion region or space charge layer appears at the junction 11 with the electric field moving farther into the lightly doped P− region 15 than in to the heavily doped P+ zone 13. As the reverse voltage is increased, the space charge layer spreads, continuing to move farther into the P− region, until it reaches the surface of the P− layer. With further increase in voltage, the field starts to move into the P+ region 13 at which point it can no longer widen. Upon further increase, an avalanche breakdown occurs within the body of the pellet 16.

It has been determined that the voltage required to force the space charge region to the surface in upper P+ type zone 13 should be between 20 and 70% of the desired breakdown voltage. In the 100 to 2000 volt range, the charge uncovered by the space charge layer in the P− region 15 does not vary much. Calculations, verified by tests, indicate that the sheet resistance $R_S$ for P− field spread region 17 should be high, preferably greater than 1000 ohms per square. This sheet resistance is calculated in the same manner as in the literature. Unfortunately, with present techniques, it is extremely difficult to produce an epitaxial layer having the preferred sheet resistance. However, layers with sheet resistances readily producible with present epitaxial techniques do spread the space charge region enough to increase surface breakdown voltages appreciably.

Figure 4:
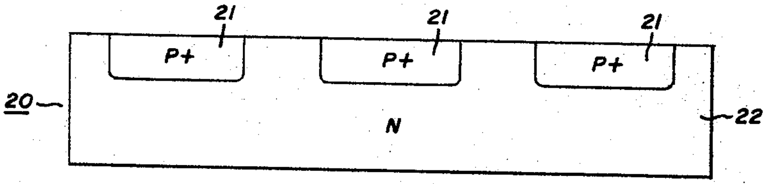
FIGURE 4 illustrates a semiconductor wafer having a plurality of junctions formed by a planar process and illustrates a wafer utilized in another embodiment of the invention.
Figure 5:
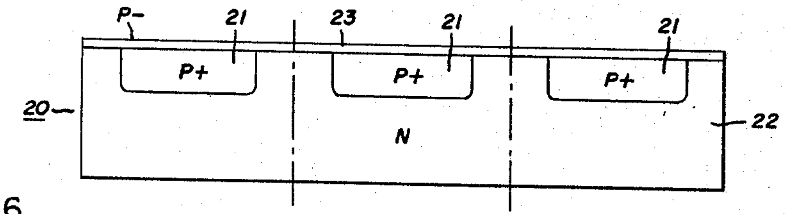
FIGURE 5 is a central vertical section through the wafer of FIGURE 4 after a deposition step.
Figure 6:
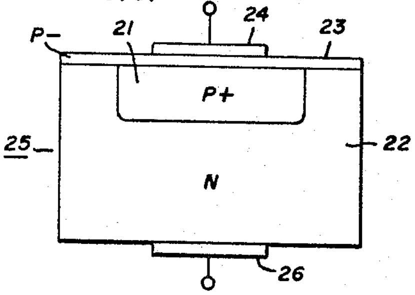
FIGURE 6 is a central vertical section through a finished rectifier pellet constructed in accordance with the method illustrated in FIGURES 4 and 5.

Another method of producing devices which operate in the manner taught in the copending Gentry application supra is illustrated using FIGURES 4, 5 and 6. FIGURE 4 illustrates a semiconductor wafer 20 having a number of discrete P+ type regions 21 formed in the upper surface. The remainder of the wafer 20 constitutes a lower N type zone 22. The wafer 20 as thus far described may best be formed by diffusion using a method known in the art as the planar technique.

Figure 2:
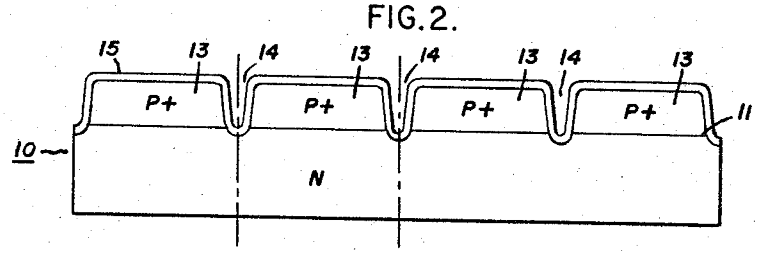
FIGURE 2 is a central vertical section through the wafer of FIGURE 1 illustrating cutting or grooving and epitaxial deposition steps employed in carrying out the invention by one method.

The next step in device formation is to form a layer 23 of high resistivity P type material on the upper major face of the pellet as illustrated in FIGURE 5. The conductivities and zone and layer thicknesses may be as described in connection with the devices illustrated in FIGURES 1, 2 and 3. Next, the wafer is cut by conventional techniques into a number of parts each of the type illustrated in FIGURE 6, each part having an upper P+ type zone 21 and a body of N type material and a part of the P− layer 23 extending outwardly around the P+ type region 21. Again, the P+ type region 21, having a high surface impurity concentration, will dope the portion of P− type layer 23 just over the P+ type zone but not out away from this zone. In order to complete the device and make a practical rectifier, an upper ohmic contact or electrode 24 is provided (as by alloying aluminum) on the upper major face of the rectifier pellet 25 just over the P+ type zone 21 and a lower ohmic contact or electrode 26 is provided on lower major face of the pellet. Obviously, the electrodes can be applied prior to or after pelletizing.

While particular structures wherein the invention is particularly useful have been illustrated and described, it will, of course, be understood that the invention is not limited thereto since many modifications varied to fit particular operating requirements and environments will be apparent to those skilled in the art. The invention is capable of broad application and its peculiar properties are taken advantage of in semiconductor devices utilizing materials other than those described and such devices formed in other ways without departing from the concept of the invention. Further, it is contemplated that the duals of the devices, i.e., devices which are essentially the same in structure but having opposite conductivities for the zones illustrated, are well within the scope of the invention. Those skilled in the art will recognize that other diffusion sources may be employed to produce the conversions described. Accordingly, the invention is not considered limited to the examples chosen for the purposes of disclosure and it is contemplated that the appended claims will cover any such modifications as fall within the true spirit and scope of the invention.

What I claim as new and desire to secure by Letters Patent of the United States is:

1. The method of producing semiconductor devices including starting with a semiconductor wafer having at least two zones of opposite conductivity type defining at least one rectifying junction of subjacent a face thereof, forming grooves in said face portion extending through the said junction and defining individual pellets for subsequent pelletizing, epitaxially depositing a layer of semiconductor material of the same conductivity as the face portion but lightly doped relative thereto on the surface of said grooved face and in said grooves whereby the portions of said junction exposed by said grooves are covered by said lightly doped layer, removing selected portions of said deposited layer for subsequent attachment of electrodes while leaving said junction portions covered, and severing the wafer along the grooves to produce individual junction-protected units.

2. The method of producing semiconductor devices including starting with a semiconductor wafer having at least two zones of opposite conductivity type defining at least one rectifying junction subjacent a face thereof, forming grooves in said face portion extending through the said junction and defining individual pellets for subsequent pelletizing, epitaxially depositing a layer of semiconductor material of the same conductivity as the face portion but lightly doped relative thereto at least in said grooves whereby the portions of said junction exposed by said grooves are covered by said lightly doped layer, and severing the wafer along the grooves to produce individual junctions in protected units.

3. The method of producing semiconductor devices including starting with a semiconductor wafer of one conductivity type, forming a plurality of discrete regions of opposite conductivity type material in one face thereof defining rectifying junctions subjacent the said face with said junctions exposed between the said discrete regions and thereby defining individual pellets for subsequent pelletizing, epitaxially depositing a layer of semiconductor material of the same conductivity type as the discrete regions formed in the one face but lightly doped relative thereto on the surface of said face and covering the exposed portions of said junctions, and severing said wafer between the exposed portions of said junctions leaving the said junctions covered to produce individual junction-protected units.

References Cited

UNITED STATES PATENTS

| | | | |
|---|---|---|---|
| 2,980,830 | 4/1961 | Shockley. | |
| 3,000,768 | 9/1961 | Marinace | 148—1.5 |
| 3,040,218 | 6/1962 | Byzkowski | 29—25.3 |
| 3,135,638 | 6/1964 | Cheney | 29—25.3 |
| 3,152,939 | 10/1964 | Borneman | 156—3 |
| 3,165,811 | 1/1965 | Kleimack | 29—25.3 |

WILLIAM I. BROOKS, *Primary Examiner.*

JOHN F. CAMPBELL, *Examiner.*

UNITED STATES PATENT OFFICE
CERTIFICATE OF CORRECTION

Patent No. 3,332,143 July 25, 1967

Finis E. Gentry

It is hereby certified that error appears in the above numbered patent requiring correction and that the said Letters Patent should read as corrected below.

Column 3, line 9, for "reevrse" read -- reverse --; column 6, line 75, strike out "of".

Signed and sealed this 9th day of July 1968.

(SEAL)
Attest:

Edward M. Fletcher, Jr.
Attesting Officer

EDWARD J. BRENNER
Commissioner of Patents